United States Patent
Lin et al.

(10) Patent No.: US 9,087,708 B2
(45) Date of Patent: Jul. 21, 2015

(54) IC WITH FLOATING BURIED LAYER RING FOR ISOLATION OF EMBEDDED ISLANDS

(71) Applicant: Texas Instruments Incorporated, Dallas, TX (US)

(72) Inventors: John Lin, Chelmsford, MA (US); Philip L. Hower, Concord, MA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 13/960,472

(22) Filed: Aug. 6, 2013

(65) Prior Publication Data
US 2015/0041907 A1   Feb. 12, 2015

(51) Int. Cl.
| | | |
|---|---|---|
| H01L 21/70 | (2006.01) | |
| H01L 29/06 | (2006.01) | |
| H01L 27/092 | (2006.01) | |
| H01L 21/8238 | (2006.01) | |
| H01L 27/02 | (2006.01) | |
| H01L 27/06 | (2006.01) | |

(52) U.S. Cl.
CPC .... *H01L 29/0646* (2013.01); *H01L 21/823878* (2013.01); *H01L 21/823892* (2013.01); *H01L 27/0251* (2013.01); *H01L 27/092* (2013.01); *H01L 27/0629* (2013.01)

(58) Field of Classification Search
CPC .......................... H01L 29/0646; H01L 27/092
USPC ......................................................... 257/369
See application file for complete search history.

(56) References Cited

U.S. PATENT DOCUMENTS

| | | | | |
|---|---|---|---|---|
| 4,825,275 | A * | 4/1989 | Tomassetti | 257/370 |
| 5,134,537 | A * | 7/1992 | Buss et al. | 361/154 |
| 5,541,123 | A * | 7/1996 | Williams et al. | 438/202 |
| 8,264,038 | B2 | 9/2012 | Pendharkar et al. | |
| 2005/0142792 | A1* | 6/2005 | Williams et al. | 438/369 |
| 2005/0272207 | A1* | 12/2005 | Williams et al. | 438/261 |
| 2010/0032756 | A1* | 2/2010 | Pendharkar et al. | 257/337 |
| 2011/0012196 | A1* | 1/2011 | Williams et al. | 257/343 |
| 2012/0018804 | A1* | 1/2012 | Khemka et al. | 257/337 |
| 2013/0032882 | A1* | 2/2013 | Salcedo et al. | 257/355 |
| 2013/0320498 | A1* | 12/2013 | Salcedo | 257/565 |

* cited by examiner

*Primary Examiner* — Jarrett Stark
*Assistant Examiner* — Mohammad M Hoque
(74) *Attorney, Agent, or Firm* — Jacqueline J. Garner; Frank Cimino

(57) ABSTRACT

An integrated circuit (IC) includes a substrate having a p-type semiconductor surface. A first nwell includes an area surrounding a first plurality of semiconductor devices formed in the semiconductor surface having a first n-buried layer (NBL) thereunder. A vertical diode formed in the semiconductor surface surrounds the first nwell including a pwell on top of a floating NBL ring. A second nwell formed in the semiconductor surface includes an area surrounding the floating NBL ring and surrounds a second plurality of semiconductor devices having a second NBL thereunder.

10 Claims, 3 Drawing Sheets

IC WITH FLOATING BURIED LAYER RING FOR ISOLATION OF EMBEDDED ISLANDS

FIELD

Disclosed embodiments relate to the field of integrated circuits. More particularly, disclosed embodiments relate to buried layer arrangements for raising the breakdown voltage for circuits including both high voltage devices and low voltage devices.

BACKGROUND

Conventional analog circuits frequently include high-voltage (HV) devices such as drain extended metal oxide semiconductor (DEMOS) transistors and buried collector bipolar transistors. Such analog circuits can operate at supply voltages of above 100 volts. It is desirable to integrate the HV devices with complementary metal oxide semiconductor (CMOS) devices on the same integrated circuit (IC) chip using a single process to reduce cost and complexity. In one arrangement an island (e.g., silicon island) having low voltage CMOS devices that can be an electrostatic discharge (ESD) sensitive region of the IC is surrounded by a HV "tank" having high voltage devices, and is thus embedded within. The island is junction isolated from the HV tank and they may be in proximity to one another.

The devices in the island and the devices in the HV tank both generally include a buried layer thereunder. The layout design rule for ESD tolerance of a given IC can specify a maximum spacing between the buried layer in the island to buried layer in the HV tank, where the breakdown voltage from devices at the edge of the island to the HV tank generally decreases as this spacing decreases.

SUMMARY

Disclosed embodiments recognize the proximity of the respective buried layers in a junction isolated island having electrostatic discharge (ESD)-sensitive devices and the surrounding high-voltage (HV) tank having HV devices to satisfy an ESD layout rule can lead to a degraded avalanche breakdown between devices at the edge of the island and the HV tank due to bipolar snapback (from the parasitic NPN transistor) in the event of an ESD strike. Disclosed vertical diode rings include floating buried layers for isolation of devices in embedded islands from surrounding HV tanks which can satisfy a stringent ESD layout rule without compromising the vertical voltage blocking capability of the isolated island which generally includes ESD-sensitive devices. By adding a disclosed vertical diode ring including a floating buried layer having a pwell on top of the floating buried layer between the isolated island and the high-voltage tank, disclosed embodiments have been found to provide a robust isolation blocking voltage while meeting a given ESD layout design rule.

BRIEF DESCRIPTION OF THE DRAWINGS

Reference will now be made to the accompanying drawings, which are not necessarily drawn to scale, wherein.

DETAILED DESCRIPTION

Figure 1A:
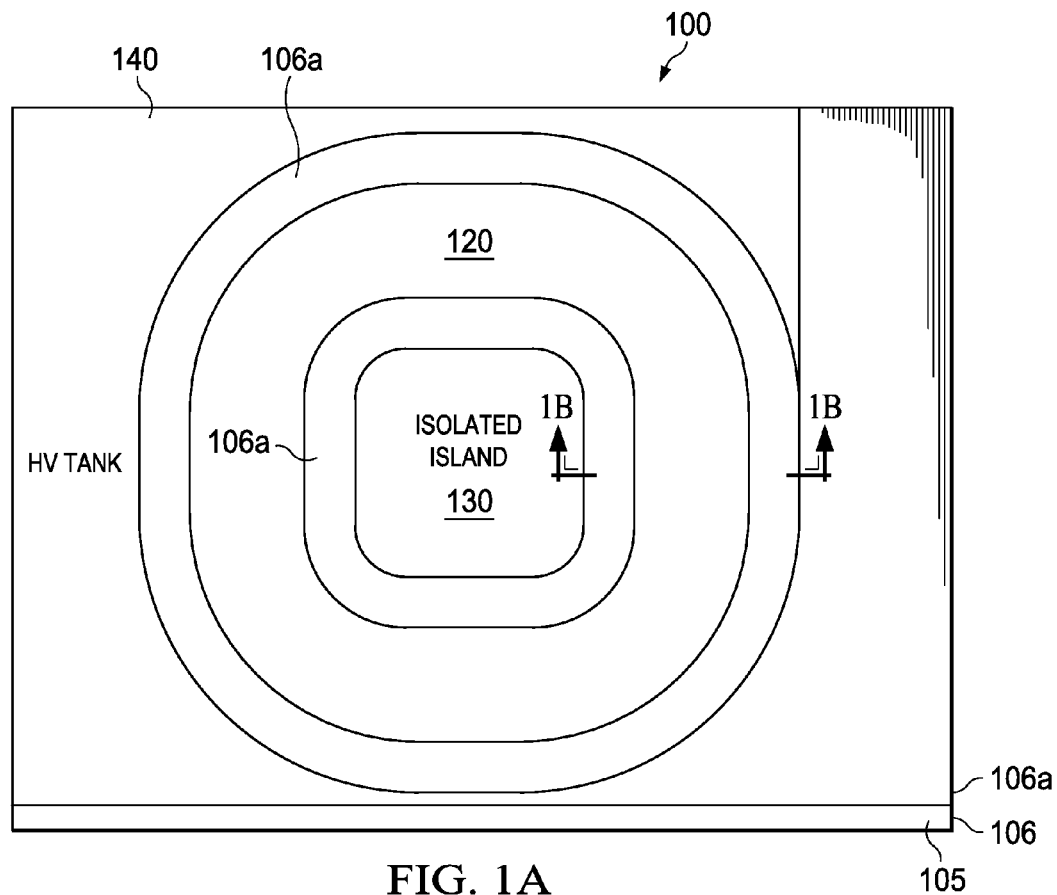
FIG. 1A is a top view of a structure within a portion of example integrated circuit (IC) having a disclosed vertical diode ring including a floating buried layer for improving isolation between an isolated island including ESD-sensitive devices and a high-voltage (HV) tank including HV devices, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Figure 1B:
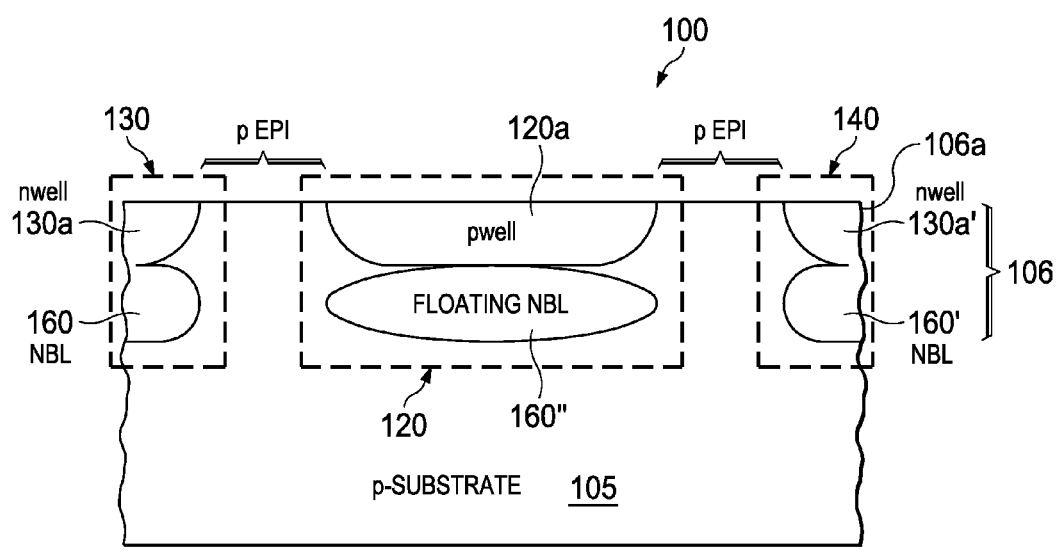
FIG. 1B is a one-sided cross sectional view of the example IC in FIG. 1A having a disclosed vertical diode ring including a floating buried layer for improving isolation between the isolated island including ESD-sensitive devices and a HV tank including HV devices.

FIG. 1A is a top view of a structure 100 within a portion of example integrated circuit (IC) having a disclosed vertical diode ring 120 including a floating n+ buried layer (NBL) ring for improving isolation between an isolated island 130 which may have ESD-sensitive devices (e.g., low voltage CMOS devices) and a surrounding HV tank 140, according to an example embodiment. "Floating" as used herein refers to both of the terminals of the vertical diode ring 120 not being connected to any other layer (e.g., no contacts through the pre-metal dielectric (PMD) 240 shown in FIG. 2) so that in operation of the IC the vertical diode ring 120 is not biased relative to any other region, and thus electrically floats. The arrow shown in FIG. 1A defines the range for the one-sided cross sectional view shown in FIG. 1B described below. FIG. 1B is a one-sided cross sectional view of the structure 100 within a portion of example IC in FIG. 1A having a disclosed vertical diode ring 120 including a floating n-buried layer (NBL) ring 160" for improving isolation between the ESD-sensitive island 130 and the HV tank 140. The spacing between the NBL 160 and NBL 160' is generally <50 µm, and the floating NBL ring 160" is generally centered in this spacing.

A HV tank refers to a large area n-type region containing HV devices junction isolated from the substrate and low-voltage devices in the isolated island 130. In operation of the IC, the HV tank 140 can float from ground potential to a high voltage, such as up to 700v, and needs to remain isolated from devices on the rest of the IC for proper IC operation, which is made more challenging when biased to such high voltage levels.

The IC including structure 100 is formed on a substrate 105 having a p-type semiconductor surface layer 106; such as a p-epitaxial surface, including a top surface 106a. The substrate 105 and/or the p-type semiconductor surface layer 106 can comprise silicon, silicon-germanium (SiGe), or other semiconductor material. One particular arrangement is a SiGe semiconductor surface on a silicon substrate. Structure 100 can be repeated on the IC a plurality of instances if the design has a need to isolate two or more isolated islands 130 each having ESD sensitive regions.

Within the isolated island 130 and the HV tank 140 there are generally a plurality devices including both transistors and passive devices which are connected together to provide the desired functionality of the IC. for example, NPN and PNP bipolar transistors, PMOS and NMOS (CMOS) transistors, laterally diffused metal oxide semiconductor (LDMOS) transistors, diodes, as well as capacitors, can all be junction isolated using disclosed embodiments when appropriate design rules are satisfied, such as provided in a given BiCMOS process.

Example ESD-sensitive regions in isolated islands such as isolated island 130 to be protected from low junction breakdown include devices within any n-type device region that needs to be isolated from the HV tank 140, particularly those wired in assembly to an outside pin. Disclosed vertical diode rings 120 including a floating NBL ring 160" with a pwell 120*a* on top as shown in FIG. 1B (described below) are not configured to provide ESD protection. Rather, disclosed vertical diode rings 120 are configured to act as a spacer to avoid premature (low voltage) lateral breakdown between isolated island 130 and HV tank 140 and vertical breakdown between the nwell in the isolated island 130 and the p-type semiconductor surface layer 106 without violating a given spacing rule (a 40 μm spacing rule) for the spacing between the isolated island 130 and the HV tank 140.

The nwell 130*a* is shown having rounded corners. Rounded corners improve breakdown performance. In one embodiment the floating NBL ring 160" follows a racetrack pattern concentric with the nwell 130*a*, and the rounded corners the nwell 130*a* have a minimum radius of curvature of 10 μm.

Disclosed embodiments recognize in the absence of the floating NBL ring 160" the equipotential lines during reverse bias of the nwell 130*a* in the isolated island 130 (and the nwell 130*a'* in the HV tank 140, both with respect to the substrate 105 will wrap around the HV tank 140 as well as the isolated island 130 causing premature breakdown. That is, the HV tank 140 will no longer be able to hold high voltages. The insertion of the floating NBL ring 160" keeps the equipotentials during reverse bias aligning more or less horizontally thus eliminating hot spots that would arise if equipotentials wrap around the HV tank 140 and/or the isolated island 130.

Within isolated island 130 and HV tank 140 of structure 100 there is generally both NMOS devices formed in pwells and PMOS devices formed in the nwells (nwell 130*a* in isolated island 130 and nwell 130*a'* in the HV tank 140). Pwells can be formed within the nwell framed isolated island 130 and nwell framed HV tank 140 to provide the body for forming NMOS devices, as well as for PNP bipolar devices serving as the emitter as well as collector, with the nwell 130*a* in isolated island 130 and nwell 130*a'* in HV tank 140 providing the n-base.

The pwell 120*a* on top of the floating NBL ring 160" functions as a channel stop. Disclosed embodiments recognize without the pwell 120*a* on top of the floating NBL ring 160", the lightly doped p-type semiconductor surface layer 106 can be inverted by a metal wire running across the gap between the isolated island 130 and the HV tank 140, which would otherwise result in a loss of isolation.

In some high-voltage process flows, the respective nwells 130*a* and 130*a'* are formed at the same time and extend deep enough to touch their respective NBLs 160 and 160', which is the arrangement shown in FIG. 1B. The pwell 120*a* may also touch its floating NBL ring 160", which is also the arrangement shown in FIG. 1B. However, the nwells 130*a* and 130*a'* need not touch their respective NBL 160 and 160', and/or the pwell 120*a* not touch its floating NBL ring 160", such as in a process where the p-type semiconductor surface layer 106 is an epitaxial layer that is relatively thick (e.g., >4 μm, such as 4 to 12 μm. In this alternate embodiment, as shown below in FIG. 2 described below, a deeper but more lighter-doped nwell may be used together with an N+ sinker layer 210 to provide a low resistance connection to the NBLs to seal off the periphery of the HV tank 140 and the periphery of the isolated island 130.

Figure 2:
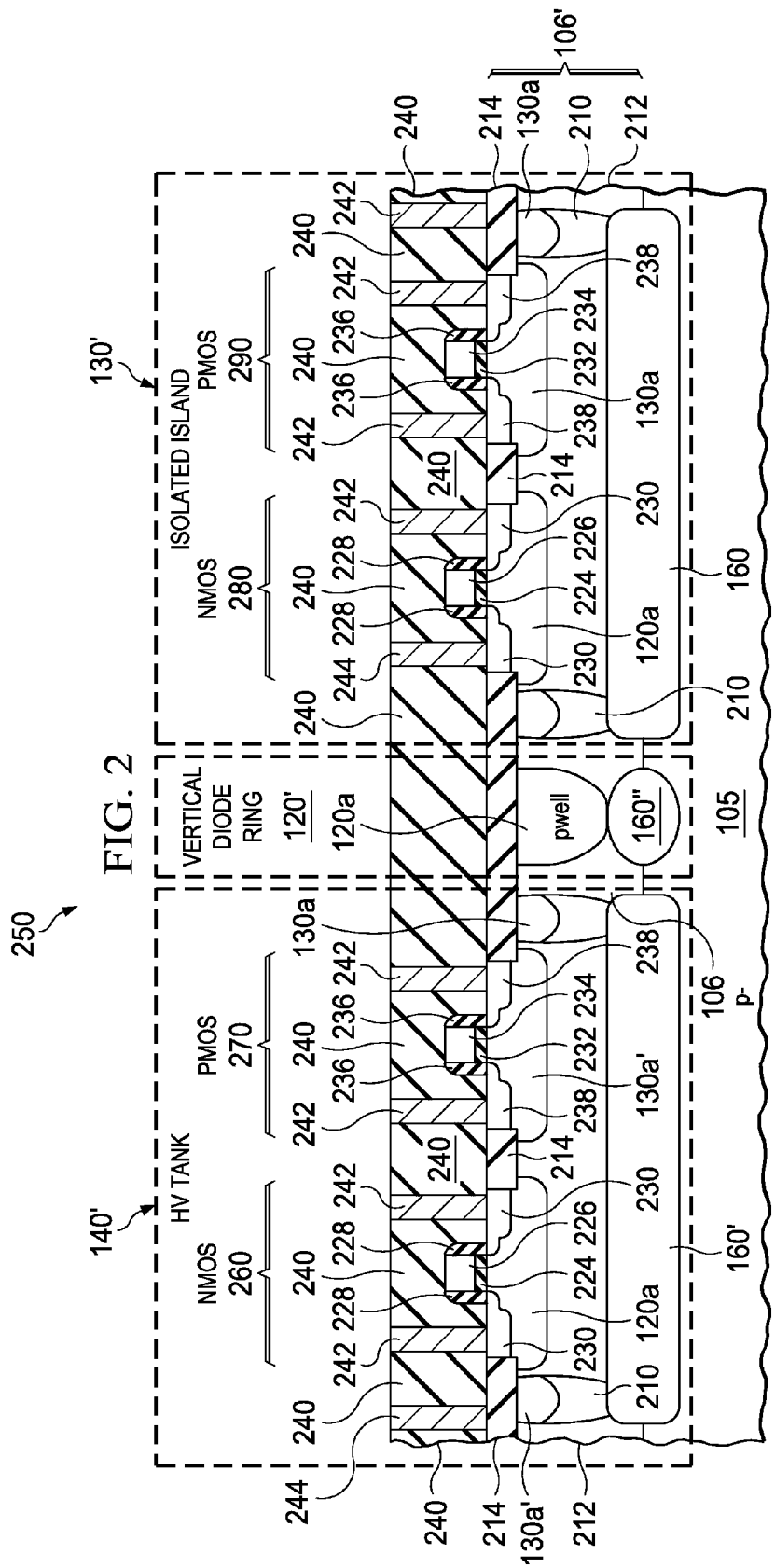
FIG. 2 is a one-sided cross sectional view of the example IC having a disclosed vertical diode ring including a floating buried layer for improving isolation between the isolated island including ESD-sensitive devices and a HV tank including HV devices, showing metal oxide semiconductor (MOS) devices within both the island and the HV tank.

FIG. 2 is a one-sided cross sectional view of a structure 250 including complementary metal oxide semiconductor (CMOS) devices within a portion of example IC 250 having a disclosed vertical diode ring 120' including a floating NBL ring 160" for improving isolation between the isolated island 130' and the HV tank 140', according to an example embodiment. MOS devices are shown within both the isolated island 130' and the HV tank 140'.

The IC 250 includes a substrate 105 shown as a p-type semiconductor substrate. A p-type epitaxial semiconductor layer 106' is shown on the top surface of the substrate 105. NMOS 260 and PMOS 270 are in HV tank 140' and NMOS 280 and PMOS 290 are in the isolated island 130'. Although NMOS 260 and NMOS 280, as well as PMOS 270 and PMOS 290, are shown having the same layout and described as having the same layers (e.g. wells, gate dielectrics), NMOS 260 and PMOS 270 may be drain extended high voltages transistors (e.g., LDMOS transistors) while NMOS 280 and PMOS 290 may be low voltage transistors. In one embodiment all the transistors on the IC may be high-voltage transistors, say, 20V to 40V capable transistors, as opposed to CMOS transistors.

An NBL including NBL 160 (for isolated island 130'), NBL 160' (for HV tank 140') and floating NBL ring 160" (for vertical diode ring 120') is formed at an interface between the substrate 105 and the p-type epitaxial semiconductor layer 106'. The spacing between NBL 160' and NBL 160 may be limited by an ESD design rule to about 30 or 40 μm.

N+ sinkers 210 are formed in the p-type epitaxial semiconductor layer 106' under the nwells 130*a* and 130*a'* extending from a top surface of the p-type epitaxial semiconductor layer 106' to the NBLs 160 and 160'. Optional field dielectric (e.g. field oxide) 214 is formed at positions shown at a top surface of the p-type epitaxial semiconductor layer 106'. NMOS 260, NMOS 280, and vertical diode ring 120' include a p-well 120*a* that may be formed using known methods (ion implantation with lithography) at a top surface of the p-type epitaxial semiconductor layer 106' extending to a final depth of about 0.5 to 5.0 μm. Similarly, the n-wells 130*a* and 130*a'* may be formed using known methods (ion implantation with lithography) in the HV tank 140' and isolated island 130' extending to a final depth of about 0.5 to 5.0 μm.

The NMOS transistors 260 and 280 includes a gate dielectric layer 224, a gate electrode 226, gate sidewall spacers 228, and n-type source and drain regions 230. Similarly, PMOS transistors 270 and 290 include a gate dielectric layer 232, a gate electrode 234, gate sidewall spacers 236, and p-type source and drain regions 238. The gate electrodes 226, 234 may comprise polysilicon in one particular embodiment. A pre-metal dielectric (PMD) layer 240 is formed on top surfaces of the NMOS and PMOS transistors. CMOS contacts 242 and a deep n-well contact 244 are formed in the PMD to make electrical connections to the n-type source and drain regions 230 and p-type source and drain regions 238.

During operation of the IC including structure 250 depicted in FIG. 2, a potential up to several hundred volts may be applied to the nwells 130*a'* in the HV tank 140' through contact via deep n-well contact 244 with respect to the p-type epitaxial semiconductor layer 106'/substrate 105, which is typically grounded. At the same time, a potential up to 20 to 40 volts (isolation blocking voltage) may be applied between the isolated island and HV tank.

Although the spacing between NBL 160' and NBL 160 may be limited by an ESD design rule (e.g., to 40 µm), disclosed vertical diode rings 120' including a floating NBL ring 160" have been found to significantly improve the isolation between the isolated island 130' and the HV tank 140'. As a result, disclosed ICs may thus be operated at up to several hundred volts in the HV tank 140' above the substrate potential, while the isolated island 130' may be operated in the tens of volts with respect to the HV tank. This is advantageous because it provides capability to interface with a wider range of inputs and outputs than a CMOS circuit with a more limited operation voltage range.

Disclosed NBLs 160, 160', 160" can be formed using a variety of methods. For example, in one example, a first oxide layer, typically 100 to 200 nms of thermally grown silicon dioxide, but possibly deposited by plasma enhanced chemical vapor deposition (PECVD), is formed on a top surface of the p-type epitaxial semiconductor layer 106'. An NBL photoresist pattern can then be formed on a top surface of the first oxide layer by known photolithographic methods to define regions for NBL ion implantation, including NBL 160 and 160', as well as floating NBL ring 160" by exposing the top surface of the first oxide layer.

A first set of n-type dopants, such as antimony, but possibly including arsenic and/or phosphorus, is ion implanted into the regions defined for NBL ion implantation in a total dose of $3 \times 10^{14}$ to $1 \times 10^{16}$ atoms/cm$^2$, at one or more energies of 10 to 100 keV, to place implants into NBLs 160, 160' and 160", each extending from the top surface of the p-type epitaxial semiconductor layer 106' to a depth of about 20 to 100 nanometers. The NBL photoresist pattern may be removed after ion implanting the first set of n-type dopants, commonly by exposing a wafer having a plurality of IC die to an oxygen containing plasma, followed by a wet cleanup to remove any organic residue from the top surface of the first oxide layer. In an alternate embodiment, the NBL photoresist pattern may be removed prior to ion implanting the first set of n-type dopants, and the first oxide layer blocks the implanted n-type dopants from regions outside those defined for NBL ion implantation.

An oxide strip process reduces a thickness of the first oxide layer by about 25 to 75 percent. The oxide strip process is typically performed by immersing the wafer in an aqueous solution of dilute hydrofluoric acid, which is commonly buffered to maintain etch uniformity. An oxidizing anneal operation can follow in which about 1 to 20 nanometers of silicon dioxide can be grown on the top surface of the substrate in the regions defined for the NBL ion implants, and generally no more than 5 nanometers of silicon dioxide are grown in the existing first oxide layer regions, to form an NBL anneal oxide layer of varying thickness. Oxide growth in the regions defined for the NBL ion implants may consume some silicon from the substrate to form an indented region on the top surface of the substrate. N-type dopants in the NBL implanted regions 160, 160' and 160" diffuse outward and become activated during the oxidizing anneal operation, to form NBL regions 160, 160' and 160".

Figure 3:
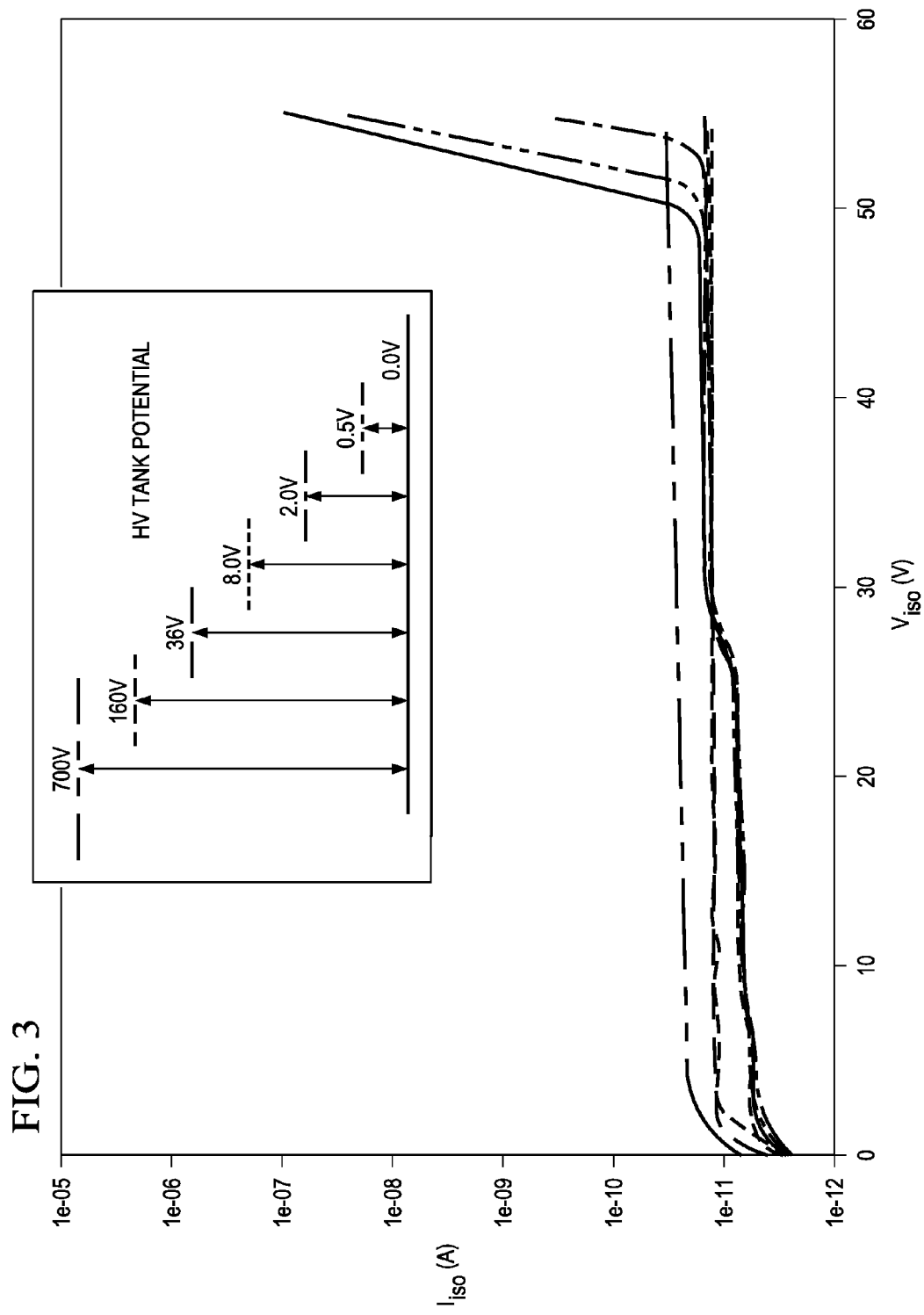
FIG. 3 shows experimentally determined breakdown voltage data taken from an actual device in an isolated island of a disclosed IC including a disclosed vertical diode ring as a function the potential difference (isolation voltage) between the isolated island and the HV tank positioned 40 µm away.

FIG. 3 shows experimental breakdown voltage data taken from an actual device in an isolated island 130' of a disclosed IC having a disclosed vertical diode ring as a function of the potential applied to the nwell 130a'/NBL 160' of a HV tank 140'. The HV tank 140' was positioned about 40 µm away from the isolated island 130'. $V_{iso}$ is the voltage difference (or isolation voltage) between the isolated island 130' and the HV tank 140' and $L_{iso}$ the resulting current. The breakdown voltage can be seen to be around 50 to 55 volts for a tank potential up to 700 v.

Disclosed embodiments can be used to form semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. An integrated circuit (IC), comprising:
a substrate having a p-type semiconductor surface;
a first nwell including an area surrounding a first plurality of semiconductor devices formed in said semiconductor surface having a first n-buried layer (NBL) thereunder;
a vertical diode formed in said semiconductor surface surrounding said first nwell including a pwell on top of a floating NBL, wherein the floating NBL is separate from and surrounds the first NBL; and
a second nwell formed in said semiconductor surface including an area surrounding a second plurality of semiconductor devices, surrounding said floating NBL, and having a second NBL thereunder, wherein the second NBL is separate from and surrounds the floating NBL.

2. The IC of claim 1, wherein said second plurality of semiconductor devices include higher voltage devices compared to a maximum voltage tolerance of said first plurality of semiconductor devices.

3. The IC of claim 2, wherein said first plurality of semiconductor devices include p-channel metal oxide semiconductor (MOS) transistors and n-channel MOS (NMOS) transistors, and said second plurality of semiconductor devices include drain extended PMOS and drain extended NMOS transistors.

4. The IC of claim 1, wherein said first nwell has rounded corners.

5. The IC of claim 4, wherein said floating NBL follows a racetrack pattern concentric with said first nwell, and wherein said rounded corners of said first nwell have a minimum radius of curvature of 10 µm.

6. The IC of claim 1, wherein said p-type semiconductor surface is an epitaxial layer on said substrate, and wherein said substrate is a single crystal p-type silicon substrate.

7. The IC of claim 1, further comprising an N+ sinker layer positioned below said first nwell and said second nwell to provide a low resistance connection from said first nwell and said second nwell to said first NBL and said second NBL, respectively.

8. The IC of claim 1, wherein said first nwell and said second nwell extend to said first NBL and said second NBL, respectively.

9. The IC of claim 1, wherein a spacing between said first NBL and said second NBL is <50 µm, and said floating NBL is centered in said spacing.

10. An integrated circuit (IC), comprising:
a substrate having a p-type semiconductor surface;

a first nwell including an area surrounding a first plurality of semiconductor devices formed in said semiconductor surface having a first n-buried layer (NBL) thereunder;

a vertical diode formed in said semiconductor surface surrounding said first nwell including a pwell on top of a floating NBL, wherein the floating NBL is separate from and surrounds the first NBL; and a second nwell formed in said semiconductor surface including an area surrounding a second plurality of semiconductor devices, surrounding said floating NBL, and having a second NBL thereunder, wherein the second NBL is separate from and surrounds the first NBL;

wherein said second plurality of semiconductor devices include higher voltage devices compared to a maximum voltage tolerance of said first plurality of semiconductor devices;

wherein said first nwell has rounded corners;

wherein said floating NBL follows a racetrack pattern concentric with said first nwell, and wherein said rounded corners of said first nwell have a minimum radius of curvature of 10 μm.

\* \* \* \* \*